(12) United States Patent
Taya et al.

(10) Patent No.: US 9,546,302 B2
(45) Date of Patent: *Jan. 17, 2017

(54) BASE FILM FOR DICING SHEET AND DICING SHEET

(75) Inventors: Naoki Taya, Tokyo (JP); Masashi Ueda, Tokyo (JP); Yosuke Sato, Tokyo (JP); Masaharu Ito, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/235,844

(22) PCT Filed: Sep. 5, 2012

(86) PCT No.: PCT/JP2012/072571
§ 371 (c)(1),
(2), (4) Date: May 6, 2014

(87) PCT Pub. No.: WO2013/038966
PCT Pub. Date: Mar. 21, 2013

(65) Prior Publication Data
US 2014/0322528 A1    Oct. 30, 2014

(30) Foreign Application Priority Data

Sep. 16, 2011    (JP) .................................. 2011-203194

(51) Int. Cl.
*C09J 7/02* (2006.01)
*C09J 133/14* (2006.01)
(Continued)

(52) U.S. Cl.
CPC .......... *C09J 7/0217* (2013.01); *C08G 18/6229* (2013.01); *C08G 18/6254* (2013.01);
(Continued)

(58) Field of Classification Search
None
See application file for complete search history.

(56) References Cited

U.S. PATENT DOCUMENTS

2006/0211834 A1    9/2006    Sugawara
2006/0257651 A1*   11/2006   Shintani .................... B32B 7/12
                                                    428/355 AC
(Continued)

FOREIGN PATENT DOCUMENTS

EP    2 267 090 A2    12/2010
JP    05-211234 A     8/1993
(Continued)

OTHER PUBLICATIONS

Haruta et al., Transparent Film and Surface-Protection Film Using Said Film, WO 2011/007729, Jan. 2011, English Machine Translation.*

(Continued)

*Primary Examiner* — Humera Sheikh
*Assistant Examiner* — Elaine M Vazquez
(74) *Attorney, Agent, or Firm* — Posz Law Group, PLC

(57) ABSTRACT

A base film for a dicing sheet is provided which can suppress dicing debris from generating during the dicing of a cut object without imparting physical energy, such as electron beam or γ ray. The base film for a dicing sheet comprises a resin layer. The resin layer comprises: a ring-containing resin that is a thermoplastic resin having a monomer, as a constitutional unit, having at least one type of an aromatic ring and an aliphatic ring; and an acyclic olefin-based resin that is an olefin-based thermoplastic resin other than the ring-containing resin. The ring-containing resin in the resin layer has a content of more than 3.0 mass %. A dicing sheet (Continued)

is also provided which comprises: the base film for a dicing sheet; and a pressure-sensitive adhesive layer placed on the base film.

15 Claims, 1 Drawing Sheet

(51) Int. Cl.
*C08L 23/06* (2006.01)
*C08G 18/62* (2006.01)
*C09J 175/14* (2006.01)
*H01L 21/683* (2006.01)

(52) U.S. Cl.
CPC ............... *C08L 23/06* (2013.01); *C09J 7/021* (2013.01); *C09J 7/0271* (2013.01); *C09J 133/14* (2013.01); *C09J 175/14* (2013.01); *H01L 21/6836* (2013.01); *C08G 2170/40* (2013.01); *C09J 2201/606* (2013.01); *C09J 2203/326* (2013.01); *H01L 2221/68327* (2013.01); *Y10T 428/28* (2015.01)

(56) References Cited

U.S. PATENT DOCUMENTS

| 2008/0125531 | A1  | 5/2008 | Sugawara |
| 2010/0112305 | A1* | 5/2010 | Hong et al. ................ 428/195.1 |
| 2011/0008949 | A1  | 1/2011 | Sugimura et al. |

FOREIGN PATENT DOCUMENTS

| JP | 11-199840 A | | 7/1999 | |
| JP | 2008-159701 A | | 7/2008 | |
| WO | WO 2011/007729 | * | 1/2011 | ............. B32B 27/06 |

OTHER PUBLICATIONS

Topas Brochure, Topas Advanced Polymers, Apr. 2011.*
International Search Report of the International Searching Authority mailed Nov. 13, 2012 for the corresponding international application No. PCT/JP2012/072571 (with English translation).
Extended European Search Report mailed Mar. 17, 2015 for the corresponding EP application No. 12832328.4 (in English).
Office Action mailed Feb. 25, 2016 for the corresponding Taiwan patent application No. 101132653.

* cited by examiner

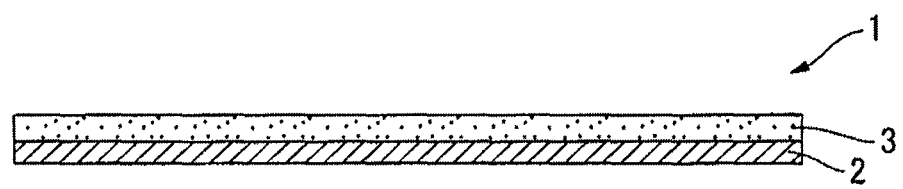

BASE FILM FOR DICING SHEET AND DICING SHEET

CROSS REFERENCE TO RELATED APPLICATIONS

This application is a U.S. national stage application of PCT/JP2012/072571 filed on Sep. 5, 2012, and claims priority to, and incorporates by reference, Japanese Patent Application No. 2011-203194 filed on Sep. 16, 2011.

TECHNICAL FIELD

The present invention relates to a dicing sheet to which a cut object such as a semiconductor wafer is applied when the cut object is cut and separated into small element pieces, and also relates to a base film used for the dicing sheet.

BACKGROUND ART

Semiconductor wafers such as silicon and gallium arsenide wafers and various types of packages (which may be collectively referred to as "cut object(s)" herein) are manufactured in a large diameter state, and these are cut and separated (diced) into small element pieces (referred to as "chip(s)" hereinafter).

A cut object to be supplied to the dicing process may be such that, for the purpose of ensuring the handling property of the cut object and chips in the dicing process and subsequent processes, a dicing sheet is preliminarily applied to a surface of the cut object opposite to the side which a cutting tool for cutting comes close to. Such a dicing sheet may typically have a base film, such as polyolefin-based film or polyvinyl chloride-based film, on which a pressure-sensitive adhesive layer is provided.

According to commonly-used full-cut dicing as a specific method for the dicing process, a rotating round blade is used for cutting a cut object. In this operation, to ensure that the cut object applied thereto with the dicing sheet is completely cut, the pressure-sensitive adhesive layer may also be cut along with the cut object, and a part of the base film may further be cut.

During the above operation, dicing debris comprising material that constitutes the pressure-sensitive adhesive layer and the base film may arise from the dicing sheet, and the obtained chips may be contaminated by the dicing debris. One form of such dicing debris is filament-like dicing debris that attaches onto a dicing line or to an area near the cross-section of each chip separated by dicing.

If the chip is enclosed in a package while a large amount of the filament-like dicing debris as described above remains on the chip, then the filament-like dicing debris attached to the chip will be decomposed by heat used for the enclosing, and the thermally decomposed substance may destroy the package and/or cause operational failure in a device to be obtained. Such filament-like dicing debris is difficult to be removed by washing, and the yield of the dicing process will thus be significantly reduced due to the occurrence of filament-like dicing debris. Hence, the filament-like dicing debris may have to be prevented from occurring when dicing is performed by using a dicing sheet.

When dicing a package as the cut object in which plural chips are enclosed by using cured resin, a dicing blade having a thicker blade width is used and the cutting depth in dicing also becomes deeper than the case of dicing a semiconductor wafer. Consequently, the amount of the base film to be cut and removed during the dicing may increase compared with the case of a semiconductor wafer, so that the generated amount of filament-like dicing debris also tends to increase.

To suppress the occurrence of such dicing debris, Patent Literature 1 discloses an invention which uses, as the base film of a dicing sheet, a polyolefin-based film having been exposed to electron beam or γ (gamma) ray with 1-80 Mrad. In this invention, it appears that a resin that constitutes the base film is crosslinked through the exposure to electron beam or γ ray thereby to suppress the dicing debris from being generated.

Patent Literature 1 exemplifies, as materials for the polyolefin-based film to be exposed to electron beam or γ ray, resins such as polyethylene, polypropylene, polymethylpentene, ethylene-vinyl acetate copolymer, ethylene-(meth)acrylic acid copolymer, ethylene-methyl(meth)acrylic acid ester copolymer, ethylene-ethyl(meth)acrylic acid copolymer, ethylene-ionomer copolymer, ethylene-vinyl alcohol copolymer, and polybutene.

PRIOR ART LITERATURE

Patent Literature

[Patent Literature 1] JP05-211234A

SUMMARY OF THE INVENTION

Problems to be Solved by the Invention

However, since the exposure to electron beam or γ ray is performed after the resin as described above is once formed into a film-like shape, an additional process for production is required, and the production cost tends to increase compared with that of a standard base film.

The present invention has been created in view of such circumstances, and an object of the present invention is to provide a means that suppresses the occurrence of dicing debris, in particular filament-like dicing debris, during the dicing of a cut object without imparting physical energy, such as electron beam or γ ray.

Means for Solving the Problems

In order to achieve the above object, first, the present invention provides a base film for a dicing sheet, the base film comprising a resin layer (A), wherein the resin layer (A) contains: a ring-containing resin (a1) that is a thermoplastic resin having at least one type of an aromatic ring and an aliphatic ring; and an acyclic olefin-based resin (a2) that is an olefin-based thermoplastic resin other than the ring-containing resin (a1), and the ring-containing resin (a1) in the resin layer (A) has a content of more than 3.0 mass % (Invention 1).

The "dicing sheet" as used in the present invention includes a dicing/die bonding sheet, and also includes one which has another base material and pressure-sensitive adhesive layer for being attached thereto with a ring frame. Further, the concept of the "sheet" as used in the present invention includes the concept of a "tape".

The "aromatic ring" as used in the present invention refers to a chemical structure that comprises at least one cyclic skeleton (referred hereinafter to as "ring structure") such that at least one of the at least one cyclic skeleton has electrons that satisfy the Hückel's rule and are delocalized in a ring form. The "aliphatic ring" as used in the present invention refers to a ring structure in which none of cyclic skeletons has electrons that are delocalized in the ring form as described above. The "olefin-based thermoplastic resin" means homopolymer and copolymer that have olefin as monomers and also means copolymer that has olefin and other molecule than olefin as monomers such that the mass ratio of a portion based on olefin unit that constitutes resin after polymerization is 1.0 mass % or more. The olefin-based thermoplastic resin may be crosslinked even to such an extent to maintain thermoplasticity. The "acyclic olefin-based resin" as used in the present invention means collectively olefin-based thermoplastic resins that have substantially no ring structure.

According to the above invention (Invention 1), the resin layer (A) contains the ring-containing resin (a1) and the acyclic olefin-based resin (a2) thereby to comprise a phase separation structure that includes a phase comprising the ring-containing resin (a1) and a phase comprising the acyclic olefin-based resin (a2). Due to the difference in physical characteristics (such as tensile elastic modulus and softening point) between those phases, filament-like dicing debris is suppressed from being generated during dicing. Therefore, dicing debris that is generated during dicing of a cut object can effectively be reduced without imparting physical energy, such as electron beam or γ ray.

In the above invention (Invention 1), it may be preferred that the acyclic olefin-based resin (a2) comprises an ethylene-based polymer (Invention 2).

The "ethylene-based polymer" as used herein means one in which the mass ratio of a portion based on ethylene unit that constitutes resin after polymerization is 1.0 mass % or more.

In the above inventions (Inventions 1-2), it may be preferred that the ring-containing resin (a1) has a fluidization temperature of 235° C. or less (Invention 3).

The "fluidization temperature" as used in the present invention refers to a value obtained by a "Koka"-type flow tester (examples of the product include Flowtester Capillary Rheometer, model number: CFT-100D, available from SHIMADZU CORPORATION). More specifically, while the temperature of a sample is risen with a rate of temperature rise of 10° C./min, a stroke displacement rate (ram/min) which varies as the temperature rises is measured by setting a load of 49.05 N and using a die having a hole shape of φ2.0 mm and a length of 5.0 mm, and a temperature dependency chart of the stroke displacement rate is obtained. If the sample is a thermoplastic resin, then the stroke displacement rate increases with a trigger of the sample temperature reaching a softening point and reaches a certain peak, and thereafter once decreases. After reaching a minimum point due to this decrease, the stroke displacement rate increases rapidly because the fluidization of whole of the sample progresses. In the present invention, the fluidization temperature is defined, when the sample temperature is risen above the softening point, as a temperature that gives the minimum value of the stroke displacement rate which appears after the stroke displacement rate has once reached the peak.

If the fluidization temperature of the ring-containing resin (a1) is 235° C. or less, then the phase of the ring-containing resin (a1) is unlikely to be coarse in the resin layer (A), so that the occurrence of chipping due to that the surface of the resin layer (A) becomes coarse is suppressed, and the brittleness resistance of the resin layer (A) is improved.

In the above inventions (Inventions 1-3), it may be preferred that the ring-containing, resin (a1) has a tensile elastic modulus at 23° C. of more than 1.5 GPa (Invention 4).

In the above inventions (Inventions 1-4), it may be preferred that the resin layer (A) contains more than 3.0 mass % and 60.0 mass % or less of the ring-containing resin (a1) (Invention 5).

The content of the ring-containing resin (a1) being within the above range allows an effect based on containing the ring-containing resin (a1) to stably be obtained, and can improve the brittleness resistance of the resin layer (A).

In the above inventions (Inventions 1-5), it may be preferred that the resin layer (A) has an internal haze value of 80% or less (Invention 6). The internal haze means a haze caused only by scattering factors inside the resin layer (A) after eliminating the haze caused by scattering factors at the surface from scattering factors of light that constitute the haze of the resin layer (A) (measurement method will be described later).

The resin layer (A) having an internal haze value within the above range may be such that the ring-containing resin (a1) and the acyclic olefin-based resin (a2) forma finely dispersed structure, so that the generation of dicing debris can be particularly suppressed and the generation of chipping can be suppressed, and the brittleness resistance of the resin layer (A) can be improved.

Second, the present invention provides a dicing sheet comprising: the above base film (Invention 1-6); and a pressure-sensitive adhesive layer placed on the base film (Invention 7).

Advantageous Effect of the Invention

According to the base film for a dicing sheet and the dicing sheet of the present invention, dicing debris that is generated during dicing of a cut object can effectively be reduced without imparting physical energy, such as electron beam or γ ray. The base film for a dicing sheet and the dicing sheet do not require treatment, such as by electron beam or γ ray, and can easily be produced.

BRIEF DESCRIPTION OF DRAWING(S)

FIG. 1 is a cross-sectional view of a dicing sheet according to one embodiment of the present invention.

BEST MODE FOR CARRYING OUT THE INVENTION

Description will hereinafter be directed to constitutional elements of the dicing sheet according to one embodiment of the present invention and a production method for the same.

1. Base Film

As shown in FIG. 1, dicing sheet 1 according to one embodiment of the present embodiment comprises, as a basic configuration, a pressure-sensitive adhesive layer 3 placed on a base film 2. This base film 2 comprises a resin layer (A).

The base film 2 may be a single layer or may comprise plural layers. When the base film 2 is a single layer, the resin layer (A) as a single layer is the base film 2. When the base film 2 comprises plural layers, the location of the resin layer (A) is not particularly limited, but it may be preferred that at least one of main surfaces of the base film 2 is the surface of the above resin layer (A). In this case, for forming the pressure-sensitive adhesive layer 3 on the base film 2 thereby to form the dicing sheet 1, the pressure-sensitive adhesive layer 3 may be formed on the resin layer (A).

(1) Resin Layer (A)

The resin layer (A) contains: a ring-containing resin (a1) that is a thermoplastic resin having at least one type of an aromatic ring and an aliphatic ring; and an acyclic olefin-based resin (a2) that is an olefin-based thermoplastic resin other than the ring-containing resin (a1).

The ring-containing resin (a1) and the acyclic olefin-based resin (a2) may have different physical characteristics, such as tensile elastic modulus and softening point, based on a difference as to whether or not the polymer that constitutes each respective resin substantially has a chemical structure comprising a cyclic skeleton (ring structure). Consequently, the ring-containing resin (a1) and the acyclic olefin-based resin (a2) may form a structure in which phase separation occurs, in the resin layer (A). That is, the resin layer (A) may be a multiphase resin layer that comprises a phase separation structure.

Specific form of the phase separation structure may vary depending on the chemical structure and the content ratio of respective resins. In general, a form may be obtained in which resin phases that have less content are dispersed in a matrix comprising a resin phase that has more content (referred hereinafter to as "dispersion form").

In view of further effectively suppressing the occurrence of dicing debris, it may be preferred that the phase separation structure in the resin layer (A) has the above dispersion form, and the diameter of phases of resin to be dispersed (which will be referred to as "dispersed phases", while a phase of resin to form the matrix will be referred to as "matrix phase", hereinafter) is small. If dimensions of the dispersed phases are unduly large in the dispersion form, then there may be concerns not only that the functionality of suppressing the occurrence of dicing debris tends to deteriorate, but that the surface property of the resin layer (A) degrades (specifically the surface becomes coarse) so that chipping is likely to occur at the cross-section region of a cut object when the resin layer (A) is used as a part of the dicing sheet 1. In addition to the above, if dimensions of the dispersed phases are unduly large, then the dispersed phases are combined to one another thereby to increase the possibility of generating those in which the length of the interface between each dispersed phase and the matrix phase in the thickness direction of the resin layer (A) is comparable with the thickness of the resin layer (A). This may lead to concern that the brittleness resistance of the resin layer (A) excessively deteriorates.

If dimensions of the dispersed phases are particularly small, then the dispersed phases may not easily be observed even by cross-dimensional observation, but a high-power microscope (e.g., scanning electron microscope) can be used to confirm whether the resin layer (A) has a dispersion form. Examples of such cases include a case where the average diameter of dispersed phases measured by cross-sectional observation of the resin layer (A) is less than 1 µm. Depending on the composition of the resin layer (A) and the production method, a phase separation structure cannot substantially be recognized in a state of not having been subjected to dicing process (a state just after being produced), but a phase separation structure may appear just when being subjected to dicing process. Even in such a case, the resin layer (A) is to be understood as having a phase separation structure in the present embodiment.

In view of stably obtaining an advantageous effect caused from containing the ring-containing resin (a1) (effect that the occurrence of dicing debris is suppressed), the content of the ring-containing resin (a1) in the resin layer (A) may be more than 3.0 mass %, preferably 3.5 mass % or more, and more preferably 5.0 mass % or more. In view of suppressing such as workability of the resin layer (A) from deteriorating, the content of the ring-containing resin (a1) in the resin layer (A) may preferably be 60.0 mass % or less, more preferably 55 mass % or less, and most preferably 45 mass % or less. In view of causing the phase separation structure of the resin layer (A) to easily have the above dispersion form, it may be preferred that the mass ratio of the content of the ring-containing resin (a1) to the content of the acyclic olefin-based resin (a2) is outside a range of 0.8 to 1.25. Therefore, it may particularly be preferred that the content of the ring-containing resin (a1) in the resin layer (A) is 5.0 mass % or more and 45 mass % or less.

That the phase separation structure of the resin layer (A) is particularly preferable can be determined in terms of an internal haze. The value of an internal haze (internal haze value) of the resin layer (A) being 80% or less allows the particle diameter of dispersed phases to sufficiently be small, so that not only suppression of the occurrence of dicing debris but also suppression of chipping occurrence and improvement in brittleness resistance can be achieved at a high level. The internal haze value of the resin layer (A) may preferably be 50% or less, and more preferably 40% or less.

A method of measuring an internal haze will be described in detail.

The measurement principle may be such that both surfaces of a sheet-like sample as a measurement object are covered by transparent or semitransparent cover layers and the surfaces of the sample are closely contacted with the cover layers at their interfaces thereby to eliminate the influence of the haze due to scattering factors at the surfaces of the sample.

More specifically, transparent pressure-sensitive adhesive tapes as the cover layers may be attached to both surfaces of the sheet-like sample, for example, and the haze of the sheet-like sample to which these pressure-sensitive adhesive tapes are attached may be measured. This measured value is given by Hc. The measurement of a haze may be conducted in conformity with JIS K7136. Subsequently, two pressure-sensitive adhesive tapes used as the cover layers are attached to each other to be a reference sample, of which the haze is also measured. This measured value is given by Ht. Using these two haze values measured in such a manner, the internal haze value Hi of the sample can be obtained according to the expression below.

$$Hi=Hc-Ht$$

The ring-containing resin (a1) and the acyclic olefin-based resin (a2) will then be described in detail.

(2) Ring-Containing Resin (a1)

The ring-containing resin (a1) is a thermoplastic resin that has at least one type of an aromatic ring and an aliphatic ring.

The aromatic ring refers to a chemical structure that comprises at least one cyclic skeleton (ring structure) such that at least one of the at least one cyclic skeleton has electrons that satisfy the Hückel's rule and are delocalized in a ring form. Such a cyclic skeleton having electrons delocalized in a ring form will hereinafter be referred simply to as an aroma-ring. Aroma-rings are generally classified into monocyclic rings, such as benzene ring, and condensed rings, such as naphthalene ring. Skeleton atoms that constitute an aroma-ring may consist only of carbons, or may form a hetero-ring, in which one or more skeleton atoms are other elements than carbon, such as pyridine, furan, and thiophene. Examples of aromatic ring according to the present embodiment further include non-benzenoid aroma-ring, such as cyclopentadienide anion. The number of atoms that constitute the skeleton of aromatic ring according to the present embodiment is not restricted, and one or more functional groups, such as methyl group and hydroxyl group, may be bonded to one or more atoms that constitute the skeleton. In this case, the functional group bonded to an aroma-ring may form a ring structure, such as in tetrahydronaphthalene.

The aliphatic ring refers to a ring structure in which none of cyclic skeletons has electrons that are delocalized in the ring form as in an aromatic ring. In other words, the aliphatic ring refers to a ring structure that comprises one or more cyclic skeletons other than an aroma-ring. Examples of a cyclic skeleton that forms an aliphatic ring include monocyclic ring such as cyclohexane, crosslinked ring such as norbornane and adamantane, condensed ring such as decalin, and spiro ring such as spiro[4,5]decane. A part of bonds that provide the cyclic skeleton of an aliphatic ring may be unsaturated bond, such as in norbornene, and a part of atoms that form the cyclic skeleton of an aliphatic ring may be other elements than carbon, such as in tetrahydrofuran. The number of skeleton atoms that constitute the aliphatic ring according to the present embodiment is not restricted. One or more hydrogen atoms bonded to atoms that form the cyclic skeleton of the aliphatic ring may be substituted by one or more functional groups, such as methyl group and hydroxyl group. Skeleton atoms may also constitute a carbonyl group, such as in cyclohexanone and other cyclic ketones and γ-butyrolactone and other lactones.

In the thermoplastic resin (which may hereinafter be referred to as polymer) that constitutes the ring-containing resin (a1), positions of the aromatic ring and the aliphatic ring may freely be selected. They may each be a part of a main chain of the polymer that constitutes the ring-containing resin (a1), or may each be bonded to a main chain or a side chain of the polymer, as a functional group (such as phenyl group and adamantyl group) having a ring structure. Examples of polymer in which the aromatic ring is a part of a main chain include polyester, such as polyethylene terephthalate and polybutylene terephthalate, polyimide, polyamideimide, and polyarylketone. Examples of polymer in which the aliphatic ring is a part of a main chain include cycloolefin polymer, cycloolefin copolymer, norbornene resin using monomer of norbornene, copolymer using monomers of norbornene and ethylene, copolymer using monomers of tetracyclododecene and ethylene, and copolymer using monomers of dicyclopentadiene and ethylene. Examples of functional group having a ring structure also include a group that comprises a set of rings, such as fluorene group and biphenyl group, in addition to the above phenyl group and adamantyl group.

The aromatic ring and the aliphatic ring may be included in one polymer molecule, in which case the form thereof may be such that both form a part of a main chain, or either one or both are bonded as a functional group or functional groups to a main chain or a side chain. Examples of the latter include those in which the portion that forms a part of a main chain is an aliphatic ring, such as in acenaphthylene copolymer, but which have naphthalene ring structures as functional groups.

Preferable structure of the ring-containing resin (a1) may be a structure in which the aliphatic ring including the ring of a crosslinked cyclic skeleton constitutes at least a part of a main chain of polymer that constitutes the resin, and preferable examples of resin that comprises such a structure include ring-opening metathesis polymer hydrogenated polymer of norbornene-based monomer (in particular, available as ZEONEX (registered trademark) series from ZEON CORPORATION), copolymer of norbornene and ethylene (in particular, available as TOPAS (registered trademark) series from POLYPLASTICS CO., LTD.), copolymer based on ring-opening polymerization of dicyclopentadiene and tetracyclopentadodecene (in particular, available as ZEONOR (registered trademark) series from ZEON CORPORATION), copolymer of ethylene and tetracyclododecene (in particular, available as APEL (registered trademark) series from Mitsui Chemicals, Inc.), and cyclic olefin resin which includes a polar group and of which raw materials are dicyclopentadiene and methacrylic acid ester (in particular, available as ARTON (registered trademark) series from JSR Corporation).

It is also preferred that the ring-containing resin (a1) has a structure in which the aromatic ring constitutes at least a part of a main chain of polymer that constitutes the resin. Examples of resin that comprises such a structure include styrene-butadiene copolymer (in particular, available as ASAFLEX series from Asahi Kasei Chemicals Corp., CLEAREN series from DENKI KAGAKU KOGYO KABUSHIKI KAISHA, K-Resin series from Chevron Phillips Chemical Company, Styrolux series from BASF, and Finaclear series from Atofina).

If such resin is used, then, in a region that receives shear force and frictional heat based on dicing process, the dispersion state of the phase of the ring-containing resin (a1) and the phase of the acyclic olefin-based resin (a2) may be such a state that is particularly preferable for suppressing the occurrence of dicing debris.

Polymer that constitutes the ring-containing resin (a1) may be of one type, or plural types of polymers may also be blended to be used. That the type of polymer is different refers to being different to such an extent that the physical characteristics and other properties are significantly affected such as by a state of branch (i.e., architecture of polymer), molecular weight, compounding balance of monomers that constitute the polymer, composition of monomers that constitute the polymer, and combination thereof. If plural types of polymers are used, then they may form one phase without phase separation in the resin layer (A) to form a phase separation structure with the acyclic olefin-based resin (a2), or they may form a phase separation structure with the acyclic olefin-based resin (a2) while forming different phases from one another in the resin layer (A).

The ring-containing resin (a1) may have a crosslinked structure. Any type of crosslinking agent may be used to provide a crosslinked structure, and typical examples thereof include organic peroxide, such as dicumyl peroxide, and a compound that has an epoxy group. The crosslinking agent may crosslink polymer molecules of one type that constitute the ring-containing resin (a1), or crosslink polymer molecules of different types. Bonding site of the crosslinking agent may freely be designed. Crosslinking may be performed with atoms that constitute a main chain in the polymer that constitutes the ring-containing resin (a1), or performed with atoms that constitute those, such as a side chain and a functional group, other than the main chain. The degree of crosslinking may also be freely selected, but should stay within a range where problems when the degree of crosslinking excessively progresses may not occur, such as that the workability (in particular formability) of the resin layer (A) that includes the ring-containing resin (a1) unduly deteriorates, the surface property of the resin layer (A) unduly degrades, and the brittleness resistance of the resin layer (A) deteriorates.

The ring-containing resin (a1) has thermoplasticity. The degree of this thermoplasticity can be represented by a melt flow rate (MFR) which indicates the viscosity at the time of melting, and may appropriately be set such that the resin layer (A) has a suitable phase separation structure. If the melt flow rate is unduly high, then the difference in physical characteristics from those of the acyclic olefin-based resin (a2) becomes small and concern is that the functionality of suppressing the occurrence of dicing debris tends to deteriorate. It may be preferred to also consider that higher thermoplasticity provides higher workability, such as formability. Specifically describing a degree of thermoplasticity that the ring-containing resin (a1) should have, it may be preferred, in view of the workability and other factors, that the value of melt flow rate in compliance with JIS K7210: 1999 is 0.1 g/10 min or more at a temperature of 230° C. and a load of 2.16 kgf. In view of stably achieving the suppression of the occurrence of dicing debris while ensuring high productivity (workability), the melt flow rate of the ring-containing resin (a1) may preferably be 0.5 g/10 min or more and 50.0 g/10 min or less, and more preferably 1.0 g/10 min or more and 25.0 g/10 min or less.

It may be preferred that the tensile elastic modulus at 23° C. of the ring-containing resin (a1) is more than 1.5 GPa. Details of measurement method of the tensile elastic modulus will be described later in examples. The above tensile elastic modulus being within this range may provide a large difference in physical characteristics from those of the acyclic olefin-based resin (a2), and a phase separation structure suitable for the suppression of the occurrence of dicing debris can thus be obtained in the resin layer (A). In view of stably obtaining this phase separation structure, it may be preferred that the tensile elastic modulus at 23° C. of the ring-containing resin (a1) is 2.0 GPa or more. The upper limit of the tensile elastic modulus at 23° C. of the ring-containing resin (a1) is not particularly limited from the viewpoint of suppressing the occurrence of dicing debris. If this tensile elastic modulus is unduly high, then the fluidization temperature as will be described below may be unduly high depending on the chemical structure of the ring-containing resin (a1), in which case the possibility that the phase of the ring-containing resin (a1) becomes coarse in the resin layer (A) may be high. Therefore, the upper limit of the tensile elastic modulus at 23° C. of the ring-containing resin (a1) may appropriately be set in consideration of the relationship with the fluidization temperature.

It may be preferred that the fluidization temperature of the ring-containing resin (a1) is 235° C. or less. The fluidization temperature of the ring-containing resin (a1) being within this range may provide a large difference in physical characteristics from those of the acyclic olefin-based resin (a2), and a phase separation structure suitable for the suppression of the occurrence of dicing debris can thus be obtained in the resin layer (A). In view of stably obtaining this phase separation structure, the fluidization temperature of the ring-containing resin (a1) may preferably be 210° C. or less, and more preferably 180° C. or less. As previously described, the fluidization temperature is a minimum temperature at which the fluidization of whole of a heated resin sample occurs when the sample is further heated beyond a state where the heated resin sample passes over the softening point thereby to increase the degree of freedom in deformation of molecules so that the intermolecular interaction is enhanced. The fluidization temperature being 235° C. or less may avoid a state where the phase of the ring-containing resin (a1) becomes coarse in the resin layer (A), and it can be possible to prevent the occurrence of chipping and deterioration in the brittleness resistance of the resin layer (A) while effectively suppressing the occurrence of dicing debris. If the fluidization temperature of the ring-containing resin (a1) is unduly low, then the above tensile elastic modulus at 23° C. may be reduced to 1.5 GPa or less. In this case, the difference in physical characteristics from those of the acyclic olefin-based resin (a2) may be small, and concern is that the phase separation structure suitable for suppressing the occurrence of dicing debris may be difficult to be obtained in the resin layer (A). There may also be concern that the surface property of the resin layer (A) deteriorates and chipping readily occurs at the cross-section region of the cut object during use as the dicing sheet 1. Therefore, it may be preferred that the lower limit of the fluidization temperature is 100° C. or more.

The density of the ring-containing resin (a1) is not particularly limited. In view of sufficiently increasing the difference in physical characteristics from those of the acyclic olefin-based resin (a2) and making it easy to obtain a phase separation structure suitable for suppressing the occurrence of dicing debris in the resin layer (A), it may be preferred that the density of the ring-containing resin (a1) is 1.00 g/cm$^3$ or more.

The ring-containing resin (a1) may be crystalline or non-crystalline. It may be preferred that the ring-containing resin (a1) is non-crystalline in view of being mixed with the acyclic olefin-based resin (a2) to be formed together on a film.

The melting peak temperature of the ring-containing resin (a1) when it is crystalline is not particularly limited, but may preferably be 100° C. or more and 240° C. or less in view of ensuring the workability in forming process. Measurement of the melting peak may be conducted using a differential scanning calorimeter (DSC, specific example may be Q2000 available from TA Instruments).

(3) Acyclic Olefin-Based Resin

The acyclic olefin-based resin (a2) comprises an olefin-based thermoplastic resin other than the above ring-containing resin (a1), i.e., an olefin-based thermoplastic resin that has substantially none of an aromatic ring and an aliphatic ring. In the present embodiment, as previously described, the olefin-based thermoplastic resin means homopolymer and copolymer that have olefin as monomers and also means a thermoplastic resin which is copolymer that has olefin and other molecule than olefin as monomers such that the mass ratio of a portion based on olefin unit in the resin after polymerization is 1.0 mass % or more.

Polymer that constitutes the acyclic olefin-based resin (a2) according to the present embodiment may be in a form of linear chain or may have a side chain. The polymer may also have an acyclic functional group, and the type and the substitution density thereof may be freely selected. It may be a functional group, such as alkyl group, which has low reactivity or a functional group, such as carboxylic acid group, which has high reactivity.

It may be preferred that the acyclic olefin-based resin (a2) comprises at least one type of acyclic polyolefin (collective term for homopolymer and copolymer which have olefin as monomers and which have no ring structure). If the acyclic olefin-based resin (a2) comprises acyclic polyolefin, then the difference in physical characteristics of the acyclic olefin-based resin (a2) and the ring-containing resin (a1) is more significant, so that the resin layer (A) may readily acquire a phase separation structure suitable for suppressing the occurrence of dicing debris. The degree of branching in the acyclic polyolefin is not particularly limited. As one example of polyethylene for description, both cases of low-density polyethylene that has a relatively large number of branches and high-density polyethylene that has a relatively small number of branches may allow a phase separation structure to be formed with the ring-containing resin (a1) in the resin layer (A).

Specific examples of the acyclic olefin-based resin (a2) include polyethylene (linear low-density polyethylene, low-density polyethylene, medium-density polyethylene, high-density polyethylene), ethylene-based copolymer such as ethylene-olefin copolymer (copolymer having ethylene and olefin other than ethylene as monomers), ethylene-vinyl acetate copolymer, ethylene-(meth)acrylic acid copolymer and ethylene-(meth)acrylic acid ester copolymer, polypropylene, polybutene, and polymethylpentene.

The "(meth)acrylic acid" as used herein is intended to mean both acrylic acid and methacrylic acid. Accordingly, the "ethylene-(meth)acrylic acid copolymer" may be ethylene-acrylic acid copolymer, ethylene-methacrylic acid copolymer, or ethylene-acrylic acid-methacrylic acid copolymer.

Polymer that constitutes the acyclic olefin-based resin (a2) may be of one type, or plural types of polymers may also be blended to be used. If plural types of polymers are used, then they may form one phase without phase separation in the resin layer (A) to form a phase separation structure with the ring-containing resin (a1), or they may form a phase separation structure with the ring-containing resin (a1) while forming different phases from one another in the resin layer (A).

The acyclic olefin-based resin (a2) may preferably be polyethylene (linear low-density polyethylene, low-density polyethylene, medium-density polyethylene, high-density polyethylene) or ethylene-based copolymer, such as ethylene-olefin copolymer, ethylene-vinyl acetate copolymer, ethylene-(meth)acrylic acid copolymer and ethylene-(meth) acrylic acid ester copolymer, and more preferably polyethylene (low-density polyethylene, medium-density polyethylene, high-density polyethylene) or ethylene-olefin copolymer.

Examples of olefin that constitutes ethylene-olefin copolymer include α-olefin monomers having a carbon number of 3 to 18, such as propylene, butene-1, hexene-1, octene-1, and 4-methylpentene-1.

If the above acyclic olefin-based resin (a2) is ethylene-olefin copolymer, then the mass ratio of a portion based on ethylene unit in the resin after polymerization may be 1.0 mass % or more. The mass ratio of a portion based on ethylene unit being within the above range allows the resin layer (A) to be obtained which comprises a phase separation structure suitable for the suppression of the occurrence of dicing debris.

In view of making large the difference in physical characteristics between those of the acyclic olefin-based resin (a2) and the ring-containing resin (a1) thereby to obtain the resin layer (A) having a phase separation structure suitable for the suppression of the occurrence of dicing debris, the above mass ratio of a portion based on ethylene unit in the resin after polymerization may preferably be 20 mass % or more, more preferably 50 mass % or more, and most preferably 70 mass % or more.

The acyclic olefin-based resin (a2) may have a crosslinked structure. Any type of crosslinking agent may be used to provide a crosslinked structure, and typical examples thereof include organic peroxide, such as dicumyl peroxide, and a compound that has an epoxy group. The crosslinking agent may crosslink polymer molecules of one type that constitute the acyclic olefin-based resin (a2), or crosslink polymer molecules of different types. Bonding site of the crosslinking agent may freely be designed. The crosslinking agent may be crosslinked with atoms that constitute a main chain in the polymer that constitutes the acyclic olefin-based resin (a2), or crosslinked with atoms that constitute those, such as a side chain and a functional group, other than the main chain. The degree of crosslinking may also be freely selected, but if the degree of crosslinking excessively progresses, then concern is that the difference in physical characteristics of the acyclic olefin-based resin (a2) and the ring-containing resin (a1) may be small and the functionality of suppressing the occurrence of dicing debris may thus tend to deteriorate. Therefore, the degree of crosslinking should stay within a range where such problems may not occur.

A preferable degree of the thermoplasticity in the acyclic olefin-based resin (a2) according to the present embodiment, when described as a range of the melt flow index (190° C., 2.16 kgf), may be 0.5 g/10 min or more and 10 g/10 min or less, and more preferably 2.0 g/10 min or more and 7 g/10 min or less. In view of achieving an enhanced phase separation structure in the resin layer (A), it may be preferred that the melt flow index of the acyclic olefin-based resin (a2) is comparable with or more than that of the ring-containing resin (a1).

The tensile elastic modulus at 23° C. of the acyclic olefin-based resin (a2) is not particularly limited, but may preferably be sufficiently lower than that of the ring-containing resin (a1) in view of sufficiently increasing the difference in physical characteristics from those of the ring-containing resin (a1). More specifically, it may preferably be 0.4 GPa or less, and more preferably 0.2 GPa or less.

The fluidization temperature of the acyclic olefin-based resin (a2) is not particularly limited. It may be preferred that the difference from the fluidization temperature of the ring-containing resin (a1) is small, because in this case a state where the phase of the ring-containing resin (a1) becomes coarse in the resin layer (A) is unlikely to occur and it can be possible to prevent the occurrence of chipping and significant deterioration in the brittleness resistance of the resin layer (A) while effectively suppressing the occurrence of dicing debris. In view of making easy the forming process for forming the resin layer (A) in a film-like form, it may be preferred that the fluidization temperature of the acyclic olefin-based resin (a2) is 100° C. or more and 180° C. or less.

The density of the acyclic olefin-based resin (a2) is not particularly limited. If the content of the acyclic olefin-based resin (a2) in the resin layer (A) is greater than that of the ring-containing resin (a1), then the mechanical characteristics of the acyclic olefin-based resin (a2) may affect those of the resin layer (A) in more dominant fashion, in which case concern is that minimum mechanical characteristics (such as tensile elastic modulus and fracture elongation) as required for the base film 2 may not be obtained when the density of the acyclic olefin-based resin (a2) is unduly low. In addition, the surface of the resin layer (A) may be sticky due to the reduced density, and the possibility that troubles occur during working process may increase. In this respect, it may also be preferred that the density of the acyclic olefin-based resin (a2) is set 0.900 g/cm$^3$ or more.

The acyclic olefin-based resin (a2) may be crystalline or non-crystalline. When the acyclic olefin-based resin (a2) is crystalline, the melting peak temperature is not particularly limited, but may preferably be 90° C. or more and 180° C. or less, and more preferably 100° C. or more and 150° C. or less, in view of sufficiently increasing the difference in physical characteristics from those of the ring-containing resin (a1). It may be preferred that the height of a melting peak is 5.0 W/g or less, and the melting heat quantity ΔH is 30.0 J/g or more and 120.0 J/g or less.

(4) Other Components in Resin Layer (A)

The resin layer (A) may contain other components in addition to the above ring-containing resin (a1) and acyclic olefin-based resin (a2). Examples of such other components include thermoplastic elastomer resins, such as isoprene rubber, nitrile rubber, acrylic rubber, urethane rubber, butadiene rubber, or copolymers thereof. The content of these other components in the resin layer (A) may preferably be such a content that can maintain allowing the ring-containing resin (a1) and the acyclic olefin-based resin (a2) to form a phase separation structure in the resin layer (A).

(5) Other Features of Base Film

If the base film 2 comprises a single layer, then the base film 2 comprises the above resin layer (A). If the base film 2 comprises multiple layers, then the base film 2 comprises the above resin layer (A) and another resin layer configured of one or more layers (referred collectively to as "resin layer (B)", hereinafter). In this case, the location of the resin layer (A) is not particularly limited, but it may be preferred that at least one of main surfaces of the base film 2 is the surface of the resin layer (A). That is, the resin layer (A) may be laminated so as to form a main surface at the side to contact with the pressure-sensitive adhesive layer 3 in the base film 2, and the pressure-sensitive adhesive layer 3 may be formed on the resin layer (A) when the pressure-sensitive adhesive layer 3 is formed on the base film 2 thereby to form the dicing sheet 1. In particular, if the base film 2 is multiple layers configured by laminating the resin layer (A) and the resin layer (B) on each other, then non-yielding due to rolling-up failure can be reduced when the obtained dicing sheet 1 is subjected to pre-cutting process into a certain shape.

The composition of the resin layer (B) is not particularly limited. Any known resin film may even be used as the resin layer (B). Specific examples of such a resin film include polyolefin film, polyester film, polyurethane film, polyvinyl chloride film, and polyamide film.

The thickness of the base film 2 may ordinarily be 40 to 300 μm, and preferably 60 to 200 μm. When the base film 2 comprises multiple layers, the thickness of the resin layer (A) that is a resin layer at the side to contact with the pressure sensitive adhesive layer 3 may ordinarily be 20 μm or more and 120 μm or less, and preferably 40 μm or more and 100 μm or less, to the total thickness of the base film 2. If the resin layer (A) contacting with the pressure-sensitive adhesive layer 3 has the above thickness, then dicing debris can be prevented from occurring. If the thickness of the resin layer (A) is unduly thin, then concern is that the phase separation structure may be difficult to achieve an enhanced dispersion form, and it may thus be preferred that the thickness of the resin layer (A) is determined also with consideration of properties of components that constitute the resin layer (A).

It may also be preferred that the tensile elastic modulus of the base film 2 in the present embodiment is 80 to 300 MPa. If the tensile elastic modulus is less than 80 MPa, then such a soft base film 2 may come loose after a wafer is attached to the dicing sheet 1 and they are then fixed to a ring frame, thereby causing a carrying error. If the tensile elastic modulus of the base film 2 exceeds 300 MPa, then problems may occur such as that the dicing sheet 1 itself is peeled-off from the ring frame because the load applied during the expanding process increases.

(6) Method of Producing Base Film

Method of producing the base film 2 is not particularly limited. Examples thereof include: melt extrusion method, such as T-die method and round-die method; calendar method; and solution method, such as dry method and wet method, and any method may be employed. Considering that both the ring-containing resin (a1) and the acyclic olefin-based resin (a2) contained in the resin layer (A) are thermoplastic resins, and from the view point of stably obtaining a phase separation structure in the resin layer (A), it may be preferred to employ the melt extrusion method or the calendar method. Among them, if the melt extrusion method is employed for production, then components to constitute the resin layer (A) may be kneaded, and film forming may be performed using a known extruder directly from the obtained kneaded components or from pellets which have been once produced from the obtained kneaded components.

In any of cases employing these methods, it should be noted that the resin layer (A) may have to have a uniform ratio of the content of the ring-containing resin (a1) phase and the content of the acyclic olefin-based resin (a2) phase in the obtained resin layer (A) and to have a uniform phase separation structure thereof in the resin layer (A).

Method of producing the resin layer (B) when the resin layer that constitutes the base film 2 comprises plural layers may be freely selected like in the case of the resin layer (A). Any suitable method may be employed depending on the composition of the resin layer (B) and purposes. Method of laminating the resin layer (A) and the resin layer (B) may be freely selected, and if the resin layer (B) comprises plural resin layers, method of laminating them may also be freely selected. Respective resin layers may be formed while being laminated at the same time such as by coextrusion, or separately produced resin layers may be applied to one another such as by adhesive so as to be laminated.

2. Other Constitutional Elements in Dicing Sheet

Other constitutional elements than the base film 2 in the dicing sheet 1 may be, such as, but not limited to, the pressure-sensitive adhesive layer 3 formed to contact with the resin layer (A) in the base film 2, and a release sheet for protecting the surface of the pressure-sensitive adhesive layer 3 which does not contact with the resin layer (A), i.e., the surface to which a cut object is to adhere.

(1) Pressure-Sensitive Adhesive Layer

Examples of pressure-sensitive adhesive to be used that constitutes the pressure-sensitive adhesive layer 3 include, but not limited to, those which are usually used for dicing sheets, such as rubber-based, acrylic-based, silicone-based and polyvinyl ether-based pressure-sensitive adhesives, and which may be energy ray curable-type (including ultraviolet curable-type) or heat curable-type pressure-sensitive adhesive. If the dicing sheet 1 according to the present embodiment is used as a dicing/die-bonding sheet, then adhesives may be used, such as pressure-sensitive adhesive, thermoplastic adhesive and B-stage adhesive, which have both the wafer fixing functionality and the die fixing functionality.

The thickness of the pressure-sensitive adhesive layer 3 may ordinarily be 3-100 μm, and preferably about 5-80 μm.

(2) Release Sheet

The release sheet for protecting the pressure-sensitive adhesive layer 3 may be freely selected.

Examples of the release sheet to be used include polyethylene film, polypropylene film, polybutene film, polybutadiene film, polymethylpentene film, polyvinyl chloride film, vinyl chloride copolymer film, polyethylene terephthalate film, polyethylene naphthalate film, polybutylene terephthalate film, polyurethane film, ethylene-vinyl acetate film, ionomer resin film, ethylene-(meth)acrylic acid copolymer film, ethylene-(meth)acrylic acid ester copolymer film, polystyrene film, polycarbonate film, polyimide film, and fluorine resin film. Crosslinked films thereof may also be used. Laminate film obtained by laminating a plurality of such films may also be used.

It may be preferred that the release surface (in particular the surface to contact with the pressure-sensitive adhesive layer 3) of the above release sheet has been subjected to release treatment. Examples of release agent to be used for the release treatment include alkyd-based, silicone-based, fluorine-based, unsaturated polyester-based, polyolefin-based and wax-based release agents.

The thickness of the release sheet may ordinarily be, such as, but not limited to, about 20-150 μm.

3. Method of Producing Dicing Sheet

The method of producing the dicing sheet 1 comprising a laminated body of the above base film 2 and pressure-sensitive adhesive layer 3 and other layers, such as release sheet, which may be used as necessary, is not particularly limited.

Some exemplary methods of producing the dicing sheet 1 may be as follows.

(i) The pressure-sensitive adhesive layer 3 is formed on the release sheet, and the base film 2 is pressed and bonded onto the pressure-sensitive adhesive layer 3 to be laminated. In this operation, the method of forming the pressure-sensitive adhesive layer 3 may be freely selected.

One exemplary method of forming the pressure-sensitive adhesive layer 3 may be as follows. A coating agent is prepared which contains a pressure-sensitive adhesive that constitutes the pressure-sensitive adhesive layer 3 and if necessary further contains some solvent. The coating agent is applied to one main surface of the base film 2 provided by the resin layer (A) using a coater, such as roll coater, knife coater, roll knife coater, air knife coater, die coater, bar coater, gravure coater, or curtain coater. The layer comprised of the coating agent on the base film 2 is dried thereby to form the pressure-sensitive adhesive layer 3.

As example other than the above method, a pressure-sensitive adhesive layer 3 separately formed in a sheet-like form may also be applied to the base film 2.

(ii) The base film 2 is formed and the pressure-sensitive adhesive layer 3 is formed thereon, and if necessary a release sheet is further laminated thereon. In this operation, method of forming the pressure-sensitive adhesive layer 3 may be freely selected as the above.

As example other than the above methods of (i) and (ii), a pressure-sensitive adhesive layer 3 separately formed in a sheet-like form may also be applied to the base film 2.

It is to be noted that the embodiments as heretofore explained are described to facilitate understanding of the present invention and are not described to limit the present invention. Therefore, it is intended that the elements disclosed in the above embodiments include all design changes and equivalents to fall within the technical scope of the present invention.

EXAMPLES

The present invention will hereinafter be more specifically described with reference to examples etc, but the scope of the present invention is not to be limited to these examples etc.

Example 1

(Preparation of Base Film)

Raw material for extrusion of the resin layer (A) was obtained by melting and kneading 5.0 mass parts of cycloolefin copolymer (product name: TOPAS (registered trademark) 8007 available from POLYPLASTICS CO., LTD., tensile elastic modulus at 23° C. (result obtained on the basis of Exemplary Test 1 as will be described later, here and hereinafter): 2.0 GPa, fluidization temperature (result obtained on the basis of Exemplary Test 2 as will be described later, here and hereinafter): 142° C.) as the ring-containing resin (a1), i.e., a thermoplastic resin having an aliphatic ring, and 95.0 mass parts of low-density polyethylene (product name: SUMIKATHENE (registered trademark) L705 available from Sumitomo Chemical Company, Limited, tensile elastic modulus at 23° C.: 140 MPa) as the acyclic olefin-based resin (a2) at 210° C. using a biaxial kneading machine (Labo-plastomill available from Toyo Seiki Seisaku-sho, LTD). This raw material was subjected to extrusion forming using a compact T die extruder (Labo-plastomill available from Toyo Seiki Seisaku-sho, LTD.), and a base film comprising a single layer of the resin layer (A) having a thickness of 100 μm was obtained. The internal haze value of the obtained resin layer (A) was 7.0%. (The internal haze value is a result obtained on the basis of Exemplary Test 3 as will be described later, here and hereinafter.)

(Preparation of Pressure-Sensitive Adhesive)

An energy ray curable-type pressure-sensitive adhesive composition was obtained by mixing 100 mass parts of copolymer (Mw: 500,000) provided by copolymerization of 95 mass parts of n-butyl acrylate and 5 mass parts of acrylic acid, 120 mass parts of urethane acrylate oligomer (Mw: 8,000), 5 mass parts of isocyanate-based curing agent (Coronate L available from NIPPON POLYURETHANE INDUSTRY CO., LTD.), and 4 mass parts of photopolymerization initiator (IRGACURE 184 available from Ciba Specialty Chemicals Inc).

The obtained energy ray curable-type pressure-sensitive adhesive composition was applied onto a release film treated with silicone (SP-PET3811(S) available from LINTEC Corporation) to have a film thickness after drying of 10 μm, and dried under 100° C. for 1 minute to forma laminate comprising the pressure-sensitive adhesive layer and the release film. This laminate was then applied to the above base film to transfer the pressure-sensitive adhesive layer in the laminate to the base film, and a dicing sheet was thus obtained.

Example 2

A dicing sheet was produced in the same manner in Example 1 except for changing the content of the ring-containing resin (a1) to 30.0 mass parts and the content of the acyclic olefin-based resin (a2) to 70.0 mass parts. The internal haze value of the obtained resin layer (A) was 29.8%.

Example 3

A dicing sheet was produced in the same manner in Example 1 except for changing the content of the ring-containing resin (a1) to 50.0 mass parts and the content of the acyclic olefin-based resin (a2) to 50.0 mass parts. The internal haze value of the obtained resin layer (A) was 47.8%.

Example 4

A dicing sheet was produced in the same manner in Example 2 except for changing the type of the ring-containing resin (a1) to cycloolefin copolymer (product name:

TOPAS (registered trademark) 9506 available from POLYPLASTICS CO., LTD., tensile elastic modulus at 23° C.: 1.9 GPa, fluidization temperature: 136° C.), i.e., a thermoplastic resin having another aliphatic ring. The internal haze value of the obtained resin layer (A) was 25.0%.

Example 5

A dicing sheet was produced in the same manner in Example 2 except for changing the type of the ring-containing resin (a1) to cycloolefin copolymer (product name: TOPAS (registered trademark) 5013 available from POLYPLASTICS CO., LTD., tensile elastic modulus at 23° C.: 2.3 GPa, fluidization temperature: 175° C.), i.e., a thermoplastic resin having another aliphatic ring. The internal haze value of the obtained resin layer (A) was 44.2%.

Example 6

A dicing sheet was produced in the same manner in Example 2 except for changing the type of the ring-containing resin (a1) to cycloolefin copolymer (product name: ZEONOR (registered trademark) 1060 available from ZEON CORPORATION, tensile elastic modulus at 23° C.: 2.1 GPa, fluidization temperature: 148° C.), i.e., a thermoplastic resin having another aliphatic ring. The internal haze value of the obtained resin layer (A) was 25.3%.

Example 7

A dicing sheet was produced in the same manner in Example 2 except for changing the type of the ring-containing resin (a1) to polybutylene terephthalate (product name: DURANEX 300FP available from POLYPLASTICS CO., LTD., tensile elastic modulus at 23° C.: 2.4 GPa, fluidization temperature: 230° C.), i.e., a thermoplastic resin having an aromatic ring. The internal haze value of the obtained resin layer (A) was 97.9%.

Example 8

A dicing sheet was produced in the same manner in Example 2 except for changing the type of the ring-containing resin (a1) to styrene-butadiene copolymer (product name: CLEAREN 730L available from DENKI KAGAKU KOGYO KABUSHIKI KAISHA, tensile elastic modulus at 23° C.: 1.5 GPa, fluidization temperature: 158° C.), i.e., a thermoplastic resin having an aromatic ring. The internal haze value of the obtained resin layer (A) was 98.4%.

Example 9

A dicing sheet was produced in the same manner in Example 2 except for changing the type of the acyclic olefin-based resin (a2) to linear low-density polyethylene (product name: Petrothene 730 available from TOSOH CORPORATION, tensile elastic modulus at 23° C.: 280 MPa). The internal haze value of the obtained resin layer (A) was 28.7%.

Example 10

A dicing sheet was produced in the same manner in Example 2 except for changing the type of the acyclic olefin-based resin (a2) to ethylene-methacrylic acid copolymer (product name: Nucrel (registered trademark) N1207 available from DUPONT-MITSUI POLYCHEMICALS CO., LTD, tensile elastic modulus at 23° C.: 140 MPa). The internal haze value of the obtained resin layer (A) was 52.0%.

Example 11

A dicing sheet was produced in the same manner in Example 1 except for changing the content of the ring-containing resin (a1) to 60.0 mass parts and the content of the acyclic olefin-based resin (a2) to 40 mass parts. The internal haze value of the obtained resin layer (A) was 57.0%.

Example 12

A dicing sheet was produced in the same manner in Example 2 except for changing the type of the ring-containing resin (a1) to cycloolefin copolymer (product name: ZEONOR (registered trademark) 1600 available from ZEON CORPORATION, tensile elastic modulus at 23° C.: 2.6 GPa, fluidization temperature: 220° C.), i.e., a thermoplastic resin having another aliphatic ring. The internal haze value of the obtained resin layer (A) was 82.8%.

Example 13

A dicing sheet was produced in the same manner in Example 2 except for changing the type of the acyclic olefin-based resin (a2) to ethylene-hexene copolymer (product name: Nipolon-Z TZ260 available from TOSOH CORPORATION, tensile elastic modulus at 23° C.: 390 MPa). The internal haze value of the obtained resin layer (A) was 24.8%.

Example 14

A dicing sheet was produced in the same manner in Example 2 except for changing the type of the acyclic olefin-based resin (a2) to block polypropylene (product name: Prime Polypro (registered trademark) F-730NV available from Prime Polymer Co., Ltd., tensile elastic modulus at 23° C.: 950 MPa, fluidization temperature: 175° C.). The internal haze value of the obtained resin layer (A) was 83.4%.

Example 15

Homo polypropylene (product name: Prime Polypro (registered trademark) F-704NT available from Prime Polymer Co., Ltd., tensile elastic modulus at 23° C.: 1.9 GPa, fluidization temperature: 175° C.) was prepared as a raw material for extrusion of the resin layer (B). The raw material for extrusion of the resin layer (A) as used in Example 11 and the raw material for extrusion of the resin layer (B) were subjected to extrusion forming using a compact T die extruder (Labo-plastomill available from Toyo Seiki Seisaku-sho, LTD.), and a base film of two-layer structure comprising the resin layer (A) having a thickness of 40 μm and the resin layer (B) having a thickness of 60 μm was obtained.

A dicing sheet was produced by forming a pressure-sensitive adhesive layer on the resin layer (A) of this base film in the same manner in Example 1.

Comparative Example 1

A dicing sheet was produced in the same manner in Example 1 except for not containing the ring-containing resin (a1) and changing the content of the acyclic olefin-based resin (a2) to 100 mass parts. The internal haze value of the obtained resin layer (A) was 4.3%.

Comparative Example 2

A dicing sheet was produced in the same manner in Example 1 except for changing the content of the ring-containing resin (a1) to 3 mass parts and the content of the acyclic olefin-based resin (a2) to 97 mass parts. The internal haze value of the obtained resin layer (A) was 4.9%.

Comparative Example 3

A dicing sheet was produced in the same manner in Example 2 except for substituting the ring-containing resin (a1) by homo polypropylene (product name: Prime Polypro (registered trademark) F-704NT available from Prime Polymer Co., Ltd., tensile elastic modulus at 23° C.: 1.9 GPa, fluidization temperature: 175° C.). The internal haze value of the obtained resin layer (A) was 36.5%.

Exemplary Test 1

Measurement of Tensile Elastic Modulus

Resin films each comprising the ring-containing resin (a1) or the acyclic olefin-based resin (a2) as used in the examples and the comparative examples were produced to have a thickness of 100 μm in the same manner as the above base film. The obtained was cut into a test specimen of 15 mm×140 mm, and the tensile elastic modulus at 23° C. was measured in compliance with JIS K7161: 1994 and JIS K7127: 1999. Specifically, tensile test was performed for the above test specimen with a rate of 200 mm/min using a tensile tester (Autograph AG-IS 500N available from SHIMADZU CORPORATION) after setting the distance between chucks to be 100 mm, thereby to measure the tensile elastic modulus (GPa or MPa). Measurement of the tensile elastic modulus was performed in each of the extrusion direction (machine direction: MD) and the perpendicular direction thereto (cross machine direction: CD) at the time of forming the resin film, and the average value of these measurement results was to represent the tensile elastic modulus of the resin. Results thereof are as previously described.

Exemplary Test 2

Measurement of Fluidization Temperature

Measurement of the fluidization temperature of the ring-containing resin (a1) each used in the examples and the comparative examples was performed using a "Koka"-type flow tester (examples of the product include Flowtester Capillary Rheometer, model number: CFT-100D, available from SHIMADZU CORPORATION). While the temperature of each ring-containing resin (a1) as a measurement sample was risen with a rate of temperature rise of 10° C./min, a stroke displacement rate (mm/min) varying as the temperature rising was measured by setting a load of 49.05 N and using a die having a hole shape of φ2.0 mm and a length of 5.0 mm, and a temperature dependency chart of the stroke displacement rate of the ring-containing resin (a1) was obtained. From this temperature dependency chart, the fluidization temperature was determined as a temperature at which the stroke displacement rate became minimum after passing over the peak obtained beyond the softening point. Results of the fluidization temperature are as previously described.

Exemplary Test 3

Measurement of Internal Haze Value

For base films each comprising the resin layer (A) used in the examples and the comparative examples, the internal haze value of the resin layer (A) was measured by the method below.

Transparent pressure-sensitive adhesive tapes were prepared and attached to both surfaces of the base film, and a sample for measurement of internal haze was obtained. Pressure-sensitive adhesive surfaces of tapes as prepared in the above were attached to each other, and a sample for measurement of haze of pressure-sensitive adhesive tape was obtained.

The sample for measurement of internal haze and the sample for measurement of haze of pressure-sensitive adhesive tape were subjected to measurement of haze values in conformity with JIS K7136 using a haze meter "NDH 2000" available from NIPPON DENSHOKU INDUSTRIES CO., LTD., and respective haze values were given by Hc and Ht.

Using the obtained Hc and Ht, the internal haze value Hi of the resin layer (A) was obtained according to the expression below. Results are as previously described.

$Hi=Hc-Ht$

Hi: internal haze of the resin layer (A)
Hc: haze measurement value when pressure-sensitive adhesive tapes were attached to both surfaces of the resin layer (A)
Ht: haze measurement value of pressure-sensitive adhesive tapes of which the pressure-sensitive adhesive surfaces were attached to each other Exemplary Test 4

Observation of Dicing Debris

After applying the pressure-sensitive adhesive layer of each dicing sheet produced according to the examples and the comparative examples to a BGA-type package module and then setting them on a dicing apparatus (DFD-651 available from DISCO Corporation), dicing was performed under the condition below:
  work (adherend): BGA-type package module (KE-G1250) available from KYOCERA Chemical Corporation);
  work size: 550 mm×440 mm, 1.55 mm thickness;
  dicing blade: Z1100LS3 available from DISCO Corporation;
  blade rotating speed: 50,000 rpm;
  dicing speed: 10 mm/sec;
  cut-into depth: cutting into with a depth of 40 μm from the base film surface; and
  dicing size: 5 mm×5 mm.

Thereafter, the cut chips were removed by irradiating ultraviolet rays (160 mJ/cm$^2$) from the base film side. Among lengthwise and breadthwise dicing lines, one lengthwise line and one breadthwise line located near the respective centers were subjected to a test where the number of filament-like debris particles occurring on each line was counted using a digital microscope (VHX-100 available from KEYENCE CORPORATION, magnification: ×100).

Evaluation was performed by "A" for the number of filament-like debris particles of 0 to 10, "B" for 11 to 20, and "C" for 21 or more. "A" and "B" were determined to be good while "C" being no-good. Results are listed in Table 1.

Exemplary Test 5

Observation of Chipping

With a similar procedure to that for the above evaluation of dicing debris, the cut surface of a chip subjected to dicing under the condition below was observed using a digital microscope (VHX-100 available from KEYENCE CORPORATION, magnification: ×100):
- work (adherend): silicon wafer;
- work size: 8 inches, 0.35 mm thickness;
- dicing blade: 27 HECC available from DISCO Corporation;
- blade rotating speed: 30,000 rpm;
- dicing speed: 80 mm/sec;
- cut-into depth: cutting into with a depth of 20 μm from the base film surface; and
- dicing size: 5 mm×5 mm.

When a crack having a width or depth of 20 μm or more was recognized, chipping was determined to occur thus being no-good (NG), and when such a crack was not recognized, determination was good (Good). Results are listed in Table 1.

Exemplary Test 6

Precutting Process Test

A release film was applied to the pressure-sensitive adhesive surface of each dicing sheet produced according to the examples and the comparative examples, and they were cut with a width of 290 mm to prepare a roll sample having a rolled-length of 100 m. In order for circular dicing sheets having a diameter of 207 mm to be continuously processed from this roll, cutting was performed such that the release film would be cut into 5 μm from the base material side using a die-roll. Thereafter, the circular sheets outer periphery was rolled up using a winder while being released from the release sheet. During this operation, when the circular sheets outer periphery was able to be rolled up without any trouble, determination was good (Good), and when the circular sheets periphery was broken, determination was no-good (NG). Results are listed in Table 1.

TABLE 1

|  | Observation of dicing debris | Observation of chipping | Pre-cutting process test |
| --- | --- | --- | --- |
| Example 1 | A | Good | Good |
| Example 2 | A | Good | Good |
| Example 3 | A | Good | Good |
| Example 4 | A | Good | Good |
| Example 5 | A | Good | Good |
| Example 6 | A | Good | Good |
| Example 7 | B | NG | NG |
| Example 8 | B | NG | Good |
| Example 9 | A | Good | Good |
| Example 10 | B | Good | Good |
| Example 11 | A | Good | NG |
| Example 12 | A | NG | NG |
| Example 13 | A | Good | NG |
| Example 14 | A | Good | NG |
| Example 15 | A | Good | Good |
| Comparative Example 1 | C | Good | Good |
| Comparative Example 2 | C | Good | Good |
| Comparative Example 3 | C | Good | Good |

As apparent from Table 1, dicing sheets produced according to the examples had few dicing debris particles.

INDUSTRIAL APPLICABILITY

The base film for a dicing sheet and the dicing sheet according to the present invention can be preferably used for dicing of semiconductor wafers and various kinds of packages etc.

DESCRIPTION OF REFERENCE NUMERALS

1 . . . Dicing sheet
2 . . . Base film
3 . . . Pressure-sensitive adhesive layer

The invention claimed is:

1. A dicing-sheet base film, the dicing-sheet base film comprising a resin layer, wherein
the resin layer comprises: a ring-containing resin that is a thermoplastic resin having at least one of an aromatic ring and an aliphatic ring; and an acyclic olefin-based resin that is an olefin-based thermoplastic resin other than the ring-containing resin,
wherein the resin layer contains more than 3.0 mass % and 60 mass % or less of the ring-containing resin,
the ring-containing resin has a fluidization temperature of 235° C. or less,
the resin layer comprises a phase separation structure that includes a phase comprising the ring-containing resin and a phase comprising the acyclic olefin-based resin, and
the resin layer has an internal haze value of 7.0% or more and 98.4% or less.

2. The dicing-sheet base film as recited in claim 1, wherein the acyclic olefin-based resin comprises an ethylene-based polymer.

3. The dicing-sheet base film as recited in claim 2, wherein the ring-containing resin has a tensile elastic modulus at 23° C. of more than 1.5 GPa.

4. The dicing-sheet base film as recited in claim 2, wherein the resin layer has the internal haze value of 7.0% or more and 80% or less.

5. A dicing sheet comprising: the dicing-sheet base film as recited in claim 2; and a pressure-sensitive adhesive layer placed on the dicing-sheet base film.

6. The dicing-sheet base film as recited in claim 1, wherein the ring-containing resin has a tensile elastic modulus at 23° C. of more than 1.5 GPa.

7. The dicing-sheet base film as recited in claim 6, wherein the resin layer has the internal haze value of 7.0% or more and 80% or less.

8. A dicing sheet comprising: the dicing-sheet base film as recited in claim 6; and a pressure-sensitive adhesive layer placed on the dicing-sheet base film.

9. The dicing-sheet base film as recited in claim 1, wherein the resin layer has the internal haze value of 7.0% or more and 80% or less.

10. A dicing sheet comprising: the dicing-sheet base film as recited in claim 1; and a pressure-sensitive adhesive layer placed on the dicing-sheet base film.

11. The dicing-sheet base film as recited in claim 1, wherein the acyclic olefin-based resin is polyethylene.

12. A method for dicing a cut object, the method comprising:
   applying a surface of a dicing sheet to the cut object, the dicing sheet comprising the dicing-sheet base film as recited in claim 1 and a pressure-sensitive adhesive layer placed on the dicing-sheet base film, and the surface of the dicing sheet being a surface of the pressure-sensitive adhesive layer that is opposite to a surface adhered to the dicing-sheet base, and
   cutting the cut object on the dicing sheet.

13. The method for dicing a cut object as recited in claim 12, wherein the ring-containing resin has a tensile elastic modulus at 23° C. of more than 1.5 GPa.

14. The method for dicing a cut object as recited in claim 12, wherein the acyclic olefin-based resin is polyethylene.

15. The method for dicing a cut object as recited in claim 12, wherein the resin layer has the internal haze value of 7.0% or more and 80% or less.

* * * * *